United States Patent [19]

Oshizawa et al.

[11] Patent Number: 4,845,420

[45] Date of Patent: Jul. 4, 1989

[54] DRIVE CIRCUIT DEVICE FOR INDUCTIVE LOAD

[75] Inventors: Hidekazu Oshizawa; Ryoichi Harada; Masami Okano, all of Higashimatsuyama, Japan

[73] Assignee: Diesel Kiki Co., Ltd., Tokyo, Japan

[21] Appl. No.: 249,652

[22] Filed: Sep. 27, 1988

[30] Foreign Application Priority Data

Oct. 2, 1987 [JP] Japan .................. 62-248076
Oct. 2, 1987 [JP] Japan .................. 62-248077

[51] Int. Cl.⁴ .................. G05F 1/613; H01H 47/32
[52] U.S. Cl. .................. 323/222; 323/284; 361/152; 361/153
[58] Field of Search .............. 323/222, 282, 284, 285; 361/152, 153, 187, 189, 190, 195

[56] References Cited

U.S. PATENT DOCUMENTS

| | | | |
|---|---|---|---|
| 4,048,665 | 9/1977 | Lia et al. | 323/284 |
| 4,106,008 | 8/1978 | Bergan | 363/132 |
| 4,238,710 | 12/1980 | Nelson | 323/222 |
| 4,287,436 | 9/1981 | Tezuka et al. | 307/270 |
| 4,503,480 | 3/1985 | Pickard et al. | 361/152 |
| 4,536,818 | 8/1985 | Nielsen | 361/152 |
| 4,556,926 | 12/1985 | Yanagida | 361/152 |

FOREIGN PATENT DOCUMENTS 61108577 7/1986 Japan .
61144476 7/1986 Japan .

Primary Examiner—Peter S. Wong
Attorney, Agent, or Firm—Wegner & Bretschneider

[57] ABSTRACT

In a drive circuit device for an inductive load, the inductive load and a detecting resistor are incorporated in a current supply circuit in series relation to a drive transistor. An operational amplifier is operative in response to detecting voltage fed-back from the detecting resistor, for controlling the drive transistor, in turn, for controlling supply current flowing through the inductive load to a predetermined value. Turning-on and -off of the drive transistor are controlled by a switching element operative in response to a control signal, thereby carrying out current supply to an inductive load and stoppage of the current supply. A feed-back circuit is provided, in which a response element supplies feed-back current to be controlled by the operational amplifier, to the feed-back resistor, in response to the turning-off of the drive transistor. The operational amplifier carries out feed-back control without being saturated, even at the stoppage of the current supply to the inductive load.

5 Claims, 2 Drawing Sheets

DRIVE CIRCUIT DEVICE FOR INDUCTIVE LOAD

BACKGROUND OF THE INVENTION

The present invention relates to a circuit device for driving an inductive load on the basis of a control signal.

There are known various conventional drive circuit devices for driving a solenoid (inductive load) of an electromagnetic valve. One of the known devices is disclosed in FIGS. 4(A) and 4(B) of Japanese Utility Model Application Laid-Open No. 61-108577. The drive circuit device disclosed in the Japanese utility model comprises its basic component including a current supply circuit having a power source and a drive transistor. The solenoid that is to be a subject of control is incorporated in the current supply circuit in series relation to the drive transistor.

In the above drive circuit device, current flowing through the solenoid is controlled without being subject to an influence of fluctuation in the power source voltage. Specifically, a detecting resistor is incorporated in the current supply circuit in series relation to the solenoid and the drive transistor. A voltage drop occurs at the detecting resistor in proportion to the current flowing through the solenoid. The dropped voltage serves as detecting voltage. Reference voltage is applied to a noninverting input terminal of an operational amplifier, while the detecting voltage from the detecting resistor is applied to an inverting input terminal of the operational amplifier. The operational amplifier controls base current of the drive transistor in such a manner that the voltage at the detecting resistor is made substantially equal to the reference voltage, thereby controlling the current flowing through the solenoid to a predetermined value.

In the above drive circuit device, current supply to the solenoid and stoppage of the current supply are controlled by a control signal. Specifically, a switching transistor has a collector-emitter circuit which is interposed between the base of the drive transistor and the ground side. The switching transistor is turned on and off in response to the control signal received by a base of the switching transistor. When the switching transistor is turned on, the drive transistor is turned off so that the current supply to the solenoid is stopped. On the other hand, when the switching transistor is turned off, the drive transistor is turned on so that the current supply to the solenoid is executed.

The above-described conventional drive circuit device has such a drawback that a remarkable overshoot occurs in the supply current subsequently to be described, when the current starts to be supplied to the solenoid.

Specifically, when the switching transistor is turned on and the drive transistor is turned off, the current does not flow through the solenoid, the drive transistor and the detecting resistor, so that the detecting voltage inputted to the operational amplifier from the detecting resistor is brought to zero. The operational amplifier outputs the maximum voltage (substantially equal to the power source voltage) in an attempt to raise the detecting voltage up to the reference voltage, so that the operational amplifier is saturated.

Accordingly, in a moment the switching transistor is turned off, high output voltage or large output current from the operational amplifier is supplied to the base of the drive transistor, so that the drive transistor is saturated temporarily. Thus, the supply current to the solenoid largely exceeds the predetermined value to be expected by control of the operational amplifier. Such a phenomenon that the supply current becomes excessive temporarily is called "overshoot".

The overshoot is uncontrollable and, therefore, hinders stable control of the solenoid. In case, for instance, where the above-mentioned drive circuit device is used for an electromagnetic valve which is opened and closed at high frequency, current supply to a solenoid of the electromagnetic valve and stoppage of the current supply are repeated at short intervals or cycles. Therefore, control of the electromagnetic valve is subject intensely to an influence of the overshoot occurring transiently. Since a peak value of the supply current at the overshoot fluctuates in response to the power source voltage, the control of the electromagnetic valve is subject to the influence of the fluctuation in the power source voltage. As a result, there may be a case where the timing of opening and closing of the electromagnetic valve gets out of order.

Further, after the overshoot, control by means of the operational amplifier causes the supply current to vary in a wave form and to converge into the aforesaid predetermined value at which the supply current is stabilized. During a period to a point of time the supply current is stabilized, the control of the solenoid is unstable.

Japanese Patent Application Laid-Open No. 61-144476 discloses such an arrangement that a Zener diode is interposed between the output terminal and the inverting input terminal of the operational amplifier, to limit the output voltage from the operational amplifier during stoppage of the current supply to the solenoid, thereby attempting to restrain the overshoot at the start-up of the current supply to the solenoid. Also in this case, however, a difference between the reference voltage at the noninverting input terminal of the operational amplifier and the voltage inputted to the inverting input terminal of the operational amplifier is not eliminated during stoppage of the current supply to the solenoid, so that the operational amplifier is saturated. Accordingly, the operational amplifier is not in a normal operating state in a moment the switching transistor is turned off and the drive transistor is turned on. Thus, it takes a time until the operational amplifier is returned to the normal operating state, so that the overshoot occurring during the period cannot sufficiently be restrained.

SUMMARY OF THE INVENTION

It is an object of the invention to provide a drive circuit device in which an operating amplifier is not saturated, but is in a normal state even during a period within which no current is supplied to a inductive load, whereby an overshoot of supply current to the inductive load can be restrained low sufficiently.

According to the invention, there is provided a drive circuit device for an inductive load, comprising:

(a) a current supply circuit having a power source and drive transistor means, the inductive load that is to be a subject of control being incorporated in the current supply circuit in series relation to the drive transistor means;

(b) detecting resistor means incorporated in the current supply circuit in series relation to the drive transistor means, wherein when the drive transistor means is turned on, a voltage drop occurs at the detecting resistor means in proportion to supply current flowing though the inductive load, the voltage drop serving as detecting voltage;

(c) an operational amplifier having an output terminal, a noninverting input terminal and an inverting input terminal, reference voltage being applied to the noninverting input terminal, the detecting voltage at the detecting resistor means being applied to the inverting input terminal, and the output terminal being connected to a control terminal of the drive transistor means, wherein the operational amplifier controls the drive transistor means in such a manner that the detecting voltage at the detecting resistor means is made substantially equal to the reference voltage, thereby controlling the supply current flowing through the inductive load to a predetermined value;

(d) switching means operative in response to a control signal for connecting the control terminal of the drive transistor means to a ground side and for disconnecting the control terminal of the drive transistor means from the ground side, wherein when the control terminal of the drive transistor means is disconnected from the ground side so that the drive transistor means is turned on, supply current is supplied to the inductive load, and wherein when the control terminal of the drive transistor means is grounded so that the latter is turned off, supply of the supply current to the inductive load is stopped; and (e) a feed-back circuit having response means and feed-back resistor means, wherein the response means is operative in response to the turning-off of the drive transistor means for supplying feed-back current to the feed-back resistor means to generate voltage at the same, the voltage generated at the feed-back resistor means being supplied, as feed-back voltage, to the inverting input terminal of the operational amplifier, wherein the operational amplifier controls the feed-back current flowing through the feed-back resistor means in such a manner that the feed-back voltage is made substantially equal to the reference voltage, and wherein the response means is operative in response to the turning-on of the drive transistor means for stopping supply of the feed-back current to the feed-back resistor means.

DETAILED DESCRIPTION

Figure 1:
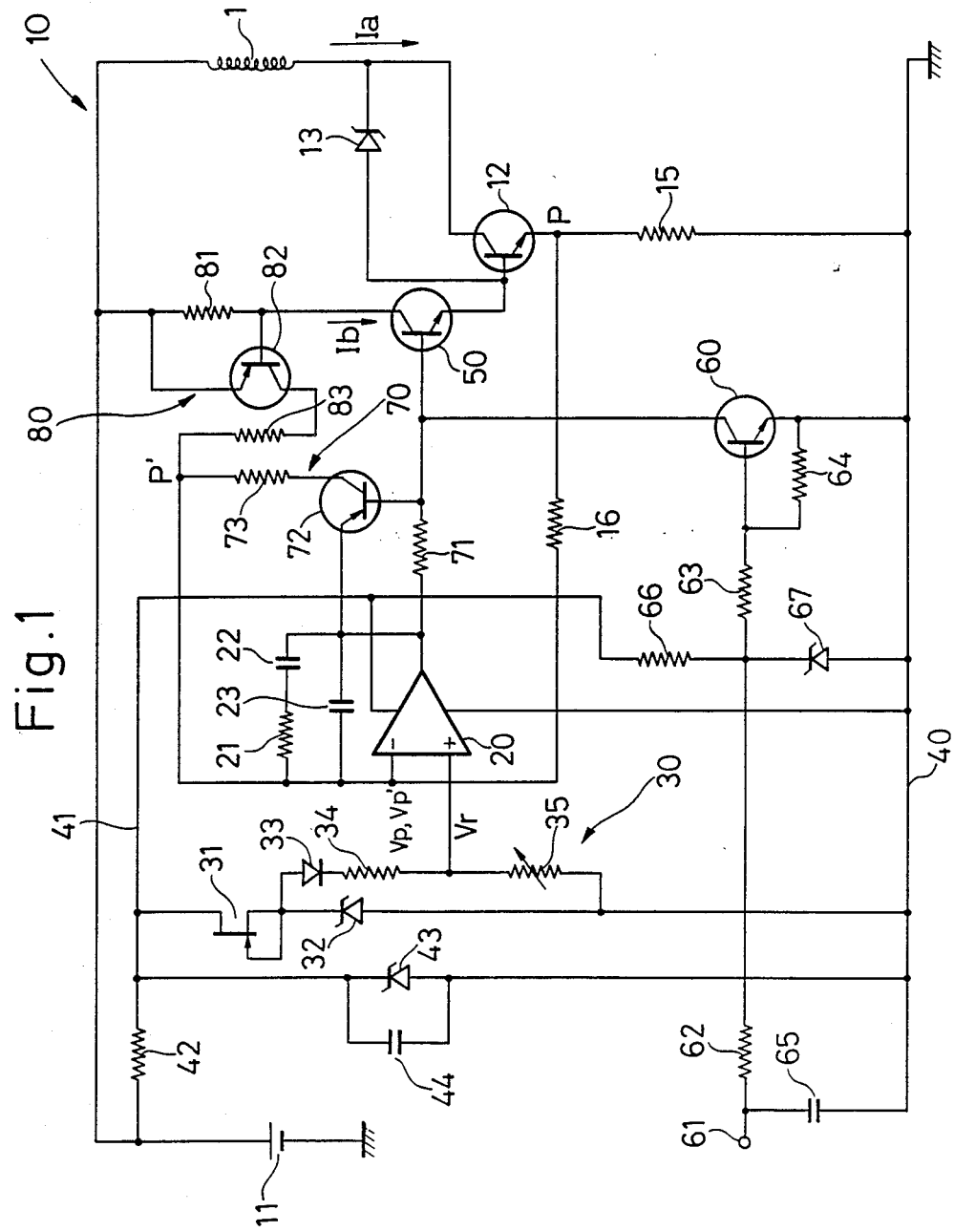
FIG. 1 is a circuit diagram of a drive circuit device for an inductive load, according to a first embodiment of the invention.

Referring first to FIG. 1, there is shown a drive circuit device for an inductive load, according to a first embodiment of the invention. The drive circuit device comprises a current supply circuit 10 which includes a battery or a power source 11 and a drive transistor 12. The battery 11 has a negative pole connected to the ground. In the current supply circuit 10, the inductive load 1 is connected between a positive pole of the battery 11 and a collector of the drive transistor 12. The inductive load 1 may be a solenoid used to control injection of fuel to a diesel engine, for example.

A Zener diode 13 is connected between the collector and a base or a control terminal of the drive transistor 12, for protecting the same from a counter electromotive force generated at the solenoid 1.

A control circuit for controlling supply current $I_a$ to the solenoid 1, to a predetermined value will next be described in detail. The control circuit has its basic components including a detecting resistor 15, an operational amplifier 20 and a reference voltage generating circuit 30.

The above detecting resistor 15 is extremely low in resistance value, and has one end P connected to an emitter of the drive transistor 12. The other end of the detecting resistor 15 is connected to a grounding conductor 40. When the drive transistor 12 is turned on so that the supply current $I_a$ to the solenoid 1 flows through the detecting resistor 15, a voltage drop occurs at the detecting resistor 15 so that the voltage $V_p$ at the one end P of the detecting circuit 15 is raised to a value higher than the ground voltage 0 (zero) V. The voltage $V_p$ is in proportion to the supply current $I_a$, and serves as detecting voltage. The one end P of the detecting resistor 15 is connected to an inverting input terminal of the operational amplifier 20 through a resistor 16 relatively high in resistance value. Accordingly, the detecting voltage $V_p$ is fed back to the inverting input terminal of the operational amplifier 20.

The operational amplifier 20 has a pair of power source terminals which are connected respectively to the grounding conductor 40 and a control line 41 on the power source side. The control line 41 has one end thereof which is connected to the positive pole of the battery 11 through a resistor 42, and is also connected to the grounding conductor 40 through a Zener diode 43. Thus, the control line 41 is maintained at constant voltage. A condenser 44 is connected in parallel to the Zener diode 43.

The reference voltage generating circuit 30 includes a field-effect transistor FET 31 and a Zener diode 32 connected in series to each other between the control line 41 and the grounding conductor 40, and a series circuit connected in parallel to the Zener diode 32. The series circuit includes a temperature compensating diode 33, a resistor 34 and a variable reference resistor 35. Constant current flows through the reference resistor 35, and constant voltage at the connection between the reference resistor 35 and the resistor 34 is brought to a reference voltage $V_r$ which is inputted to a noninverting input terminal of the operational amplifier 20.

An integrating circuit having a resistor 21 and a condenser 22 is connected between the output terminal and the inverting input terminal of the operational amplifier 20. A condenser 23 is connected in parallel to the integrating circuit.

The output terminal of the operational amplifier 20 is connected to a base or a control terminal of an auxiliary transistor 50. A collector of the auxiliary transistor 50 is connected to the positive pole of the battery 11, while an emitter of the auxiliary transistor 50 is connected to the base of the drive transistor 12. Current $I_b$ flowing through a collector-emitter circuit of the auxiliary transistor 50 is controlled in response to the output current from the operational amplifier 20. The current $I_b$ serves as control current or base current of the drive transistor 12. The current flowing through the collector-emitter circuit of the drive transistor 12 is controlled in response to the base current. In this manner, a feedback control loop is formed.

The operational amplifier 20 controls the output voltage or the output current in such a manner that the detecting voltage $V_p$ is brought into coincidence with the reference voltage $V_r$. Accordingly, the current flowing through the collector-emitter circuit of the drive transistor 12, that is, the supply current $I_a$ to the solenoid 1 is controlled to a predetermined value $V_r/R_{15}$, regardless of fluctuation in an amplification factor of the drive transistor 12 due to temperature change and fluctuation in the voltage of the battery 11. In this connection, $R_{15}$ is a resistance value of the resistor 15.

The current supply to the solenoid 1 and the stoppage of the current supply are controlled by a switching transistor 60 serving as switching means. The switching transistor 60 has a collector which is connected to the base of the auxiliary transistor 50. An emitter of the switching transistor 60 is connected to the grounding conductor 40. A base of the switching transistor 60 is connected, through a pair of resistors 62 and 63, to an input terminal 61 to which the control signal is inputted. Further, a bias resistor 64 is connected between the base and the emitter of the switching transistor 60. A condenser 65 is interposed between the input terminal 61 and the grounding conductor 40. The connection between the resistors 62 and 63 is connected to the control line 41 through a resistor 66, and is also connected to the grounding conductor 40 through a Zener diode 67. Thus, an overvoltage is prevented from being applied to the switching transistor 60.

When the control signal is at a low-level, the switching transistor 60 is turned off, so that the output current from the operational amplifier 20 is supplied to the base of the auxiliary transistor 50 to turn on the same. Therefore, the current $I_b$ subsequently to be described is caused to flow to the base of the drive transistor 12 through the auxiliary transistor 50, to turn on the drive transistor 12. As a result, the current $I_a$ is supplied to the solenoid 1. Since, in this state, the aforementioned feed-back control loop is formed, the supply current $I_a$ is controlled to the predetermined value.

When the control signal is at a high-level, the switching transistor 60 is turned on and, therefore, the output current from the operational amplifier 20 flows to the grounding conductor 40 through the collector-emitter circuit of the switching transistor 60, but is not supplied to the base of the auxiliary transistor 50. Accordingly, the auxiliary transistor 50 is turned off so that the base current $I_b$ does not flow to the drive transistor 12. Thus, the drive transistor 12 is also turned off. As a consequence, the current supply to the solenoid 1 is stopped.

The above-described arrangement resembles basically the previously described conventional drive circuit device.

The drive circuit device according to the first embodiment further comprises a feed-back circuit 70. The feed-back circuit 70 includes a bias resistor 71 having an extremely low resistance value and interposed between the output terminal of the operational amplifier 20 and the base of the auxiliary transistor 50, a response transistor 72 having a base and an emitter which are connected respectively to opposite ends of the bias resistance 71, and a feed-back resistor 73 having a relatively high resistance value and connected between a collector of the response transistor 72 and the inverting input terminal of the operational amplifier 20.

Moreover, the drive circuit device according to the first embodiment comprises a current limiting circuit 80. The current limiting circuit 80 includes a bias resistor 81 having an extremely low resistance value and connected between the collector of the auxiliary transistor 50 and the battery 11, a feed-back transistor 82 having a base and an emitter which are connected respectively to opposite ends of the bias resistor 81, and another feed-back resistor 83 having a relatively high resistance value and connected between a collector of the feed-back transistor 82 and the inverting input terminal of the operational amplifier 20.

The aforesaid resistor 16 interposed between the output terminal of the operational amplifier 20 and the detecting resistor 15 cooperates with the feed-back resistor 73 to form feed-back resistor means for the feed-back circuit 70. Further, the resistor 16 cooperates with the feed-back resistor 83 to form feed-back resistor means for the current limiting circuit 80.

In the drive circuit device constructed as above, the control signal inputted to the input terminal 61 repeats the high-level and the low-level alternately at short cycles. As described previously, the switching transistor 60 is turned on and off on the basis of the control signal. In response to the turning-on and -off of the switching transistor 60, the drive transistor 12 is repeatedly turned on and off alternately, so that the supply of the current $I_a$ to the solenoid 1 and the stoppage of the current supply are repeated. Thus, the electromagnetic valve is opened and closed repeatedly at short cycles.

In a state in which the switching transistor 60 is turned on so that the current is not supplied to the solenoid 1, the current flows from the output terminal of the operational amplifier 20 to the grounding conductor 40 through the bias resistor 71 and the collector-emitter circuit of the switching transistor 60, as mentioned previously. However, this current is higher than that which flows to the base of the auxiliary transistor 50 when the switching transistor 60 is turned off. By this reason, the voltage drop at the bias resistor 71 increases so that the response transistor 72 is switched from the "OFF" state to the "ON" state. As a result, a part of the current from the output terminal of the operational amplifier 20 flows, as a feed-back current, to the grounding conductor 40 through the collector-emitter circuit of the response transistor 72, the feed-back resistor 73, the resistor 16 and the detecting resistor 15. Voltage generated at one end P' of the feed-back resistor 73 serves as a feed-back voltage $V_p'$ which is applied to the inverting input terminal of the operational amplifier 20.

In the manner described above, in the state in which the drive transistor 12 is turned off so that the current is not supplied to the solenoid 1, the feed-back circuit 70 is closed whereby the feed-back voltage $V_p'$ is inputted to the inverting input terminal of the operational amplifier 20, in place of the aforesaid detecting voltage $V_p$. Accordingly, the output current from the operational amplifier 20 is controlled in such a manner that the feed-back voltage $V_{p'}$ is made equal to the reference voltage $V_r$. Since another feed-back loop is formed in this manner, the operational amplifier 20 is not saturated, but is maintained in the normal operating state. The output voltage from the operational amplifier 20 is not raised, and the output current therefrom does not also become excessive.

When the switching transistor 60 is switched from the "ON" state to the "OFF" state so that the output current from the operational amplifier 20 starts to flow to the base of the auxiliary transistor 50, the drive transistor 12 is turned on. Since, however, the output current from the operational amplifier 20 is not excessive as mentioned above, the base current of the drive transistor 12 can be suppressed low, making it possible to restrain low the overshoot of the supply current $I_a$.

Moreover, since the operational amplifier 20 is not in the saturated state, but is in the normal operating state even when the current supply to the solenoid 1 is stopped, as described above, the supply current $I_a$ can be stabilized promptly to the predetermined value, in quick response to the detecting voltage $V_p$ occurring at the detecting resistor 15 when the switching transistor 60 is switched from the "ON" state to the "OFF" state. Also in this respect, the overshoot can be suppressed low. Thus, it is possible to carry out stable control of the current supply to the solenoid 1.

Since the overshoot of the supply current $I_a$ is suppressed low as mentioned above, the supply current is subject to only a little influence of fluctuation in the power source voltage even at a point of time of a rise of the supply current. Thus, it can be ensured to prevent disorder of the opening and closing timing of the electromagnetic valve.

When the drive transistor 12 is turned on, the operational amplifier 20 responds in a moment excessively because of a delay in the rise of the current $I_a$ due to the self-induction of the solenoid 1, thereby causing excessive base current to flow instantaneously to the auxiliary transistor 50. In the embodiment, however, the base current $I_b$ flowing to the drive transistor 50 can be limited under the action of the current limiting circuit 80. It is supposed that $V_{be}$ is voltage between the base and the emitter of the transistor 41 when the same is turned on, and $R_{81}$ is a resistance value of the resistor 81. Then, when the current $I_b$ flowing through the bias resistor 81 is larger than $V_{be}/R_{81}$, the voltage drop at the bias resistor 81 turns on the feed-back transistor 82, so that a part of the current or minute current from the battery 11 flows, as feed-back current, to the grounding conductor 40 through the feed-back transistor 82, the feed-back resistor 83, the resistor 16 and the detecting resistor 15. At this time, the feed-back voltage $V_p'$ at the one end P' of the feed-back resistor 83 is inputted to the inverting input terminal of the operational amplifier 20. The operational amplifier 20 controls its output current in such a manner that the feed-back voltage $V_p'$ is made equal to the reference voltage $V_r$. As a result, even if there is a delay in the rise of the supply current $I_a$, the base current of the drive transistor 12 can be restrained to a value equal to or lower than $V_{be}/R_{81}$ Thus, also in this respect, it can be ensured to prevent the overshoot.

In the conventional drive circuit device mentioned previously, the current limiting resistor having a high resistance value is interposed between the auxiliary transistor and the battery, in order to limit the excessive base current $I_b$. It is sufficient for the embodiment, however, to use the bias resistor 81 low in resistance value, in place of the current limiting resistance. Accordingly, even if the voltage of the battery 11 is low, sufficient base current is secured so that stable current supply to the solenoid 1 can be secured, making it possible to enlarge the voltage range of the battery 11 within which the drive circuit device can be operated normally.

The integrating circuit having the condenser 21 and the resistor 22 serves to restrain vibration of the supply current at the time the supply current converges into the predetermined value from the overshoot. In this connection, since the overshoot is small, the time constant of the supply current can be reduced. Also in this respect, it is possible to improve the response ability of the operational amplifier 20.

Figure 2:
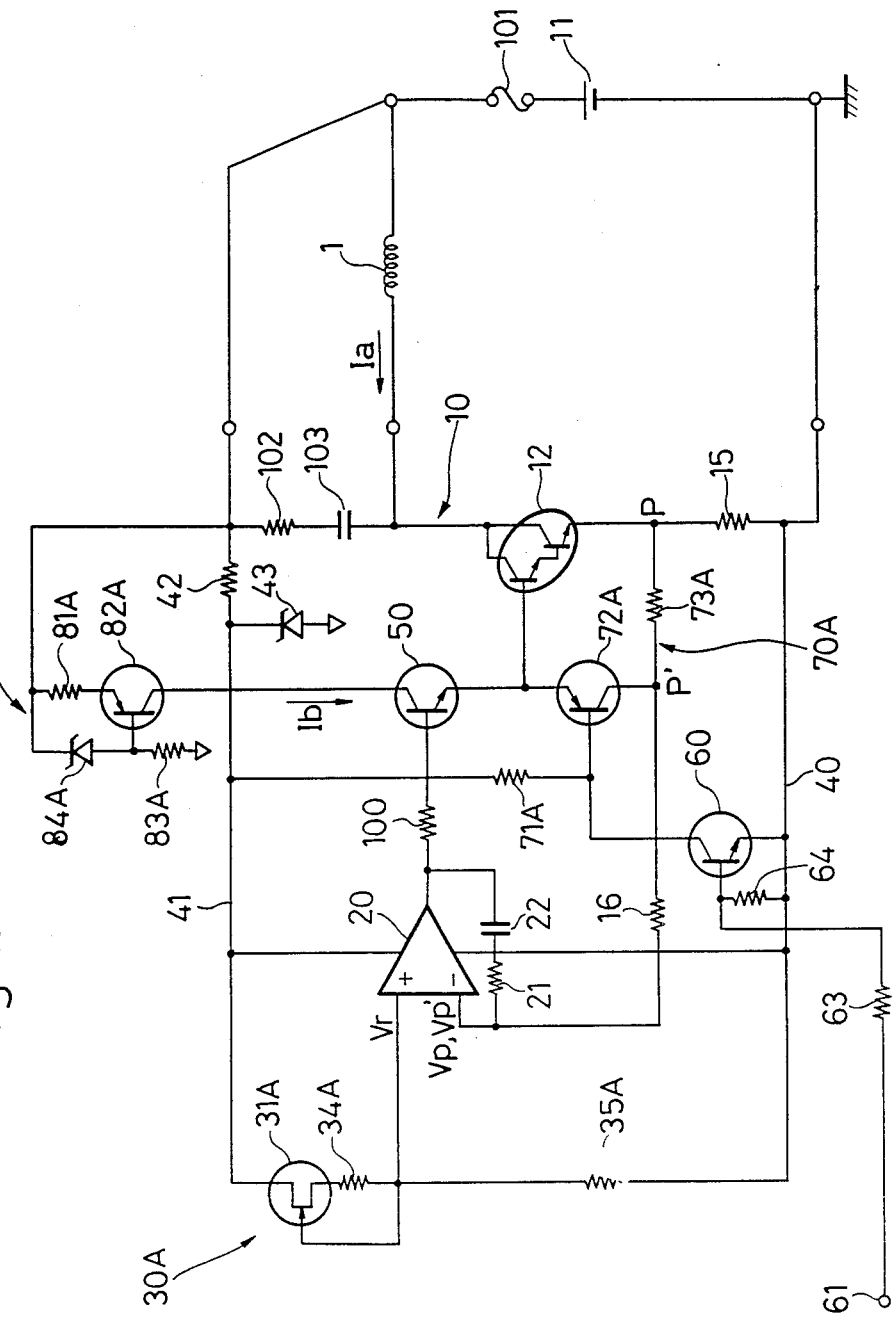
FIG. 2 is a view similar to FIG. 1, but showing a second embodiment of the invention.

Referring next to FIG. 2, there is shown a drive circuit device according to a second embodiment of the invention. In FIG. 2, component parts like or similar to those of the first embodiment illustrated in FIG. 1 are designated by the same or like reference numerals, and the description of such like or similar component parts will therefore be omitted to avoid repetition. In the second embodiment, the drive transistor 12 is formed by a pair of transistor elements which are Darlington-connected to each other.

A reference voltage generating circuit 30A, a feed-back circuit 70A and a current limiting circuit 80A of the second embodiment illustrated in FIG. 2 are different respectively from the reference voltage generating circuit 30, the feed-back circuit 70 and the current limiting circuit 80 of the first embodiment.

The reference voltage generating circuit 30A includes a constant-current circuit having a field-effect transistor 31A and a bias resistor 34A, and a reference resistor 35A connected in series to the constant-current circuit.

The feed-back circuit 70A is provided with a response transistor 72A serving as response means. The response transistor 72A has an emitter which is connected to the emitter of the auxiliary transistor 50, and is also connected to the base of the drive transistor 12. On the other hand, a base of the response transistor 72A is connected to the collector of the switching transistor 60, and is also connected to the control line 41 through a resistor 71A . The feedback circuit 70A is further provided with a feed-back resistor 73A considerably higher in resistance value than the detecting resistor 15. One end P' of the feedback resistor 73A is connected to a collector of the response transistor 72A, and is also connected to the inverting input terminal of the operational amplifier 20. The other end of the feed-back resistor 73A is connected to the one end P of the detecting resistor 15.

When the switching transistor 60 is turned off, the voltage at the control line 41 is applied to the base of the response transistor 72A through the resistor 71A, so that the response transistor 72A is turned off. As a consequence, the current $I_b$ flowing through the auxiliary transistor 50 flows, as control current, to the base of the drive transistor 12 to turn on the same, so that the current is supplied to the solenoid 1.

When the switching transistor 60 is turned on, the base of the response transistor 72A is connected to the ground to turn on the response transistor 72A. As a result, the current $I_b$ flowing through the collector-emitter circuit of the auxiliary transistor 50 flows, as feed-back current, to the grounding conductor 40 through the collector-emitter circuit of the response transistor 72A and further through the feed-back resistor 73A and the detecting resistor 15. Accordingly, the drive transistor 12 is turned off, so that the current supply to the solenoid 1 is stopped, and the feed-back voltage $V_p'$ at the one end P' of the feed-back resistor 73A is inputted to the inverting input terminal of the operational amplifier 20. The operational amplifier 20 controls its output current in such a manner that the feed-back voltage $V_p'$ is brought into coincidence with the reference voltage $V_r$, thereby controlling the current flowing through the feed-back circuit 70A. Accordingly, similarly to the first embodiment, since another feed-back loop is formed, the operational amplifier 20 is not saturated, but is maintained in a normal operating state, even in such a state that the current is not supplied to the solenoid 1.

It is preferable that a resistance value $R_{73}$ of the feedback resistor 73A and the resistance value $R_{15}$ of the detecting resistor 15 are set to satisfy the following equation:

$$R_{73} + R_{15} = V_r/I_b$$

Since $R_{15}$ is extremely low in value as compared with $R_{73}$, the above equation can be rewritten in the following manner:

$$R_{73} \neq V_r/I_b$$

In the above equations, $I_b$ represents current flowing through the collector-emitter circuit of the auxiliary transistor 50, that is, control current supplied to the base of the drive transistor 12 when the latter is turned on so that the constant current is supplied to the solenoid 1.

By setting the resistance values in the manner described above, the current flowing through the collector-emitter circuit of the auxiliary transistor 50 when the drive transistor 12 is turned off can be made substantially equal to that at the time the drive transistor 12 is turned on. Thus, no large fluctuation occurs in the output current from the operational amplifier 20 at the switching between the "ON" and "OFF" states of the drive transistor 12, making it possible to further ensure that the overshoot is restrained.

The current limit circuit 80A has a transistor 82A. The transistor 82A is provided with an emitter which is connected to the battery 11 through a resistor 81A. A collector of the transistor 82A is connected to the collector of the auxiliary transistor 50. A base of the transistor 82A is connected to the ground through a resistor 83A. A Zener diode 84A is connected between the base and the emitter of the transistor 82A. The current limiting circuit 80A serves to determine an upper limit of the current $I_b$ flowing through the collector-emitter circuit of the auxiliary transistor 50. The reason for this is that the upper limit of the voltage drop, which occurs at the bias resistor 81A when the current $I_b$ flows therethrough, is determined by setting voltage of the Zener diode 84A.

In the second embodiment illustrated in FIG. 2, a resistor 100 is connected between the output terminal of the operational amplifier 20 and the base of the auxiliary transistor 50. A fuse 101 is connected between the battery 11 and the solenoid 1. A resistor 102 and a condenser 103 are connected in parallel to the solenoid 1, for absorbing the counter electromotive force.

In this specification, each bipolar transistor employed in the drive circuit device according to the first or second embodiment is referred to merely as "transistor". Distinction between NPN type and PNP type is illustrated in the figures, but is omitted from the description. Field-effect transistors may be used in substitution for the bipolar transistors.

What is claimed is:

1. A drive circuit device for an inductive load, comprising:

(a) a current supply circuit having a power source and drive transistor means, said inductive load that is to be a subject of control being incorporated in said current supply circuit in series relation to said drive transistor means;

(b) detecting resistor means incorporated in said current supply circuit in series relation to said drive transistor means, wherein when said drive transistor means is turned on, a voltage drop occurs at said detecting resistor means in proportion to supply current flowing through said inductive load, said voltage drop serving as detecting voltage;

(c) operational amplifier having an output terminal, a noninverting input terminal and an inverting input terminal, reference voltage being applied to said noninverting input terminal, said detecting voltage at said detecting resistor means being applied to said inverting input terminal, and said output terminal being connected to a control terminal of said drive transistor means, wherein said operational amplifier controls said drive transistor means in such a manner that said detecting voltage at said detecting resistor means is made substantially equal to said reference voltage, thereby controlling said supply current flowing through said inductive load to a predetermined value;

(d) switching means operative in response to a control signal for connecting said control terminal of said drive transistor means to a ground side and for disconnecting said control terminal of said drive transistor means from said ground side, wherein when said control terminal of said drive transistor means is disconnected from said ground side so that said drive transistor means is turned on, supply current is supplied to said inductive load, and wherein when said control terminal of said drive transistor means is grounded so that the latter is turned off, supply of the supply current to said inductive load is stopped; and (e) a feed-back circuit having response means and feed-back resistor means, wherein said response means is operative in response to the turning-off of said drive transistor means for supplying feed-back current to said feed-back resistor means to generate voltage at the same, said voltage generated at said feed-back resistor means being supplied, as feedback voltage, to said inverting input terminal of said operational amplifier, wherein said operational amplifier controls said feedback current flowing through said feed-back resistor means in such a manner that said feed-back voltage is made substantially equal to said reference voltage, and wherein said response means is operative in response to the turning-on of said drive transistor means for stopping supply of the feed-back current to said feedback resistor means.

2. A drive circuit device according to claim 1, wherein said response means includes a bias resistor and a response transistor, said bias resistor being interposed between said output terminal of said operational amplifier and said control terminal of said drive transistor means, wherein said response transistor is connected between said output terminal and said inverting input terminal of said operational amplifier, wherein said feed-back resistor means has at least two resistor sections, one of said resistor sections being connected between said output terminal and said inverting input terminal of said operational amplifier in series relation to said response transistor, the other resistor section being connected between said inverting input terminal of said operational amplifier and said ground side, wherein when said drive transistor means is turned off so that a voltage drop at said bias resistor increases, said response transistor is turned on, whereby the feed-back current is supplied to said feed-back resistor means, and voltage at a connection between said one and other resistor sections serves as said feed-back voltage which is applied to said inverting input terminal of said operational amplifier.

3. A drive circuit device according to claim 1, further comprising an auxiliary transistor and a current limiting circuit, said auxiliary transistor having a control terminal connected to said output terminal of said operational amplifier, said auxiliary transistor having a current passage whose one end is connected to said control terminal of said drive transistor means, whereby said output terminal of said operational amplifier and said control terminal of said drive transistor means are connected to each other indirectly through said auxiliary transistor, wherein control current is supplied to said control terminal of said drive transistor means from said auxiliary transistor controlled by said operational amplifier, the control current flowing through said auxiliary transistor is limited by said current limiting circuit, said current limiting circuit including a bias resistor interposed between said auxiliary transistor and said power source, a feed-back transistor connected between said power source and said inverting input terminal of said operational amplifier, and feed-back resistor means, wherein said feed-back resistor means has at least two resistor sections, one of said resistor sections being connected between said power source and said inverting input terminal of said operational amplifier in series relation to said feed-back transistor, the other resistor section being connected between said inverting input terminal of said operational amplifier and said ground side, wherein when said feed-back transistor is turned on in response to an increase in a voltage drop at said bias resistor so that another feed-back current is supplied to said feed-back resistor means, voltage at a connection between said one and other resistor sections serves as another feed-back voltage which is applied to said inverting input terminal of said operational amplifier.

4. A drive circuit device according to claim 1, wherein said response means has a response transistor and feed-back resistor means, said response transistor having a current passage through which said control terminal of said drive transistor means is connected to said ground side, said response transistor being controlled by said switching means in such a manner that said current passage of said response transistor is opened and closed by said switching means, wherein one end of said feed-back resistor means is connected to said output terminal of said operational amplifier through said response transistor, and is connected to said inverting input terminal of said operational amplifier, the other end of said feed-back means being grounded, wherein when said response transistor is turned on, said feed-back current to be controlled by said operational amplifier is supplied to said feed-back resistor means, and wherein voltage at one end of said feed-back resistor means serves as said feed-back voltage which is applied to said inverting input terminal of said operational amplifier.

5. A drive circuit device according to claim 4, further comprising an auxiliary transistor whose control terminal is connected to said output terminal of said operational amplifier, said auxiliary transistor having a current passage whose one end is connected to said control terminal of said drive transistor means, whereby said output terminal of said operational amplifier and said control terminal of said drive transistor means are connected to each other indirectly through said auxiliary transistor, wherein control current is supplied to said control terminal of said drive transistor means from said auxiliary transistor controlled by said operational amplifier, wherein one end of a current passage of said response transistor is connected to said control terminal of said drive transistor means and to said one end of said current passage of said auxiliary transistor, and wherein a resistance value R of said feed-back resistor means is determined by the following equation:

$$R \neq V_r / I_b$$

where $V_r$ is the reference voltage inputted to said noninverting input terminal of said operational amplifier, and $I_b$ represents a value of said control current flowing through said auxiliary transistor in such a state that said response transistor is turned off and said drive transistor means is turned on.

* * * * *

UNITED STATES PATENT AND TRADEMARK OFFICE
CERTIFICATE OF CORRECTION

PATENT NO. : 4,845,420

DATED : July 4, 1989

INVENTOR(S) : Hidekazu OSHIZAWA et al.

It is certified that error appears in the above-identified patent and that said Letters Patent is hereby corrected as shown below:

In column 9, line 15, change "$\neq$" to --$\mp$--.

In column 12, line 38, change "$\neq$" to --$\mp$--.

Signed and Sealed this

Tenth Day of July, 1990

*Attest:*

HARRY F. MANBECK, JR.

*Attesting Officer*      *Commissioner of Patents and Trademarks*